(12) United States Patent
Shang et al.

(10) Patent No.: US 10,204,695 B2
(45) Date of Patent: Feb. 12, 2019

(54) CONTROL CIRCUIT FOR CONTROLLING A NOISE REDUCTION THIN FILM TRANSISTOR IN A SHIFT REGISTER UNIT AND METHOD OF REDUCING NOISE

(71) Applicant: BOE TECHNOLOGY GROUP CO., LTD., Beijing (CN)

(72) Inventors: Guangliang Shang, Beijing (CN); Seungwoo Han, Beijing (CN); Mingfu Han, Beijing (CN); Haoliang Zheng, Beijing (CN); Xing Yao, Beijing (CN); Hyunsic Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 79 days.

(21) Appl. No.: 15/520,191

(22) PCT Filed: Nov. 4, 2016

(86) PCT No.: PCT/CN2016/104692
§ 371 (c)(1),
(2) Date: Apr. 19, 2017

(87) PCT Pub. No.: WO2017/133284
PCT Pub. Date: Aug. 10, 2017

(65) Prior Publication Data
US 2018/0301200 A1    Oct. 18, 2018

(30) Foreign Application Priority Data

Feb. 3, 2016    (CN) .......................... 2016 1 0076597

(51) Int. Cl.
*G09G 5/00* (2006.01)
*G11C 19/28* (2006.01)
(Continued)

(52) U.S. Cl.
CPC ............... *G11C 19/28* (2013.01); *G09G 3/20* (2013.01); *G09G 3/3677* (2013.01);
(Continued)

(58) Field of Classification Search
CPC .......... G09G 3/20; G09G 3/36; G09G 3/3677; G09G 3/3688; G09G 2310/0286;
(Continued)

(56) References Cited

U.S. PATENT DOCUMENTS 5,701,136 A * 12/1997 Huq ..................... G09G 3/3677
345/100
6,064,713 A * 5/2000 Lebrun ................ G09G 3/3677
377/67
(Continued)

FOREIGN PATENT DOCUMENTS

CN    101515431 A    8/2009
CN    102651186 A    8/2012
(Continued)

OTHER PUBLICATIONS

First Office Action in the Chinese Patent Application No. 201610076597.7, dated Oct. 23, 2017; English translation attached.
(Continued)

*Primary Examiner* — Joe H Cheng
(74) *Attorney, Agent, or Firm* — Intellectual Valley Law, P.C.

(57) ABSTRACT

The present application discloses a control circuit for controlling a noise reduction thin film transistor in a shift register unit. The control circuit includes a timer for initiating a timing process when the shift register is turned on, to obtain an operating time of the shift register; a threshold voltage calculator coupled to the timer for calculating a present threshold voltage based on the operating time, a gate voltage of the noise reduction thin film transistor, and an
(Continued)

initial threshold voltage of the noise reduction thin film transistor; and a gate voltage controller coupled to the threshold voltage calculator for adjusting the gate voltage of the noise reduction thin film transistor during the noise reduction phase, to control the noise reduction thin film transistor in an ON state during the noise reduction phase.

11 Claims, 5 Drawing Sheets

(51) Int. Cl.
 *G09G 3/20* (2006.01)
 *G09G 3/36* (2006.01)
(52) U.S. Cl.
 CPC . *G09G 2310/0286* (2013.01); *G09G 2310/06* (2013.01); *G09G 2310/08* (2013.01); *G09G 2330/06* (2013.01)
(58) Field of Classification Search
 CPC ........... G09G 2310/06; G09G 2310/08; G09G 2320/00; G09G 2320/04; G11C 19/28
 See application file for complete search history.

(56) References Cited

U.S. PATENT DOCUMENTS

| | | | | |
|---|---|---|---|---|
| 6,262,702 | B1* | 7/2001 | Murade | G02F 1/1345 345/100 |
| 2002/0093581 | A1* | 7/2002 | Ikeda | H04N 5/357 348/302 |
| 2004/0032630 | A1* | 2/2004 | Aoki | G09G 3/3677 345/100 |
| 2004/0159794 | A1* | 8/2004 | Morii | H01L 27/14658 250/370.11 |
| 2008/0231566 | A1* | 9/2008 | Naugler | G09G 3/3291 345/82 |
| 2010/0164915 | A1 | 7/2010 | Kim et al. | |
| 2011/0058640 | A1* | 3/2011 | Shang | G11C 19/184 377/64 |
| 2011/0211611 | A1* | 9/2011 | Troccoli | G06K 9/0002 374/45 |
| 2012/0139883 | A1 | 6/2012 | Lee et al. | |
| 2012/0256817 | A1 | 10/2012 | Chen et al. | |
| 2014/0056399 | A1* | 2/2014 | Shang | G11C 19/28 377/68 |
| 2014/0374760 | A1* | 12/2014 | Miyake | G11C 19/00 257/59 |
| 2015/0243367 | A1* | 8/2015 | Gu | G11C 19/28 377/64 |
| 2015/0255031 | A1* | 9/2015 | Cao | G09G 3/3648 345/210 |
| 2016/0133337 | A1* | 5/2016 | Gu | G11C 19/28 377/64 |
| 2016/0268004 | A1* | 9/2016 | Li | G11C 19/28 |

FOREIGN PATENT DOCUMENTS

| | | |
|---|---|---|
| CN | 102654969 A | 9/2012 |
| CN | 102693692 A | 9/2012 |
| CN | 102968950 A | 3/2013 |
| CN | 105528986 A | 4/2016 |

OTHER PUBLICATIONS

International Search Report & Written Opinion dated Feb. 8, 2017 regarding PCT/CN2016/104692.

* cited by examiner

CONTROL CIRCUIT FOR CONTROLLING A NOISE REDUCTION THIN FILM TRANSISTOR IN A SHIFT REGISTER UNIT AND METHOD OF REDUCING NOISE

CROSS-REFERENCE TO RELATED APPLICATION

This application is a national stage application under 35 U.S.C. § 371 of International Application No. PCT/CN2016/104692 filed Nov. 4, 2016, which claims priority to Chinese Patent Application No. 201610076597.7, filed Feb. 3, 2016, the contents of which are incorporated by reference in the entirety.

TECHNICAL FIELD

The present invention relates to a control circuit for controlling a noise reduction thin film transistor in a shift resister unit, and a method of reducing noise of the shift register unit.

BACKGROUND

A liquid crystal display panel includes an array of a plurality of pixels, and a plurality of gate lines and a plurality of data lines for driving image display of the pixels. The liquid crystal display panel further includes a gate driving circuit for outputting gate scanning signals to the plurality of gate lines. The gate driving circuit converts an input clock signal through a shift register into an on/off voltage, and sequentially applies it to the gate line.

FIGS. 1A-1B are diagrams illustrating the structure of conventional shift register units. Referring to FIG. 1A, in a reset phase and an output stop holding phase, the pull down node PD is provided with a clock signal CLKB'. The pull down node PD is connected to the gate electrodes of thin film transistors T5 and T6 for noise reduction. Referring to FIG. 1B, in a reset phase and an output stop holding phase, the pull down node PD is provided with a high voltage level signal VDD. The pull down node PD is connected to the gate electrodes of thin film transistors T5 and T6 for noise reduction. In FIGS. 1A-1B, "INPUT" denotes an input terminal, "RESET" denotes a reset terminal. "PU" denotes a pull up node, "PD_CN" denotes a pull down control node, "OUT" denotes an output terminal for gate scanning signal, "VSS" denotes a low voltage signal, "CLK" denotes a clock signal, T1 is an input thin film transistor, T2 is a first reset thin film transistor, T3 is a pull up thin film transistor, T4 is a second reset thin film transistor, T7 is a first pull down node control thin film transistor, T8 is a second pull down node control thin film transistor, T9 is a first pull down control node control thin film transistor, and T10 is a second pull down control node control thin film transistor.

SUMMARY

In one aspect, the present invention provides a control circuit for controlling a noise reduction thin film transistor in a shift register unit comprising a shift register having an input terminal, an output terminal for outputting a gate scanning signal during an output phase, and the noise reduction thin film transistor coupled to the output terminal for reducing noise of the shift register by maintaining the output terminal at a low voltage level during a noise reduction phase between two output phases; the control circuit comprising a timer for initiating a timing process when the shift register is turned on, to obtain an operating time of the shift register; a threshold voltage calculator coupled to the timer for calculating a present threshold voltage based on the operating time, a gate voltage of the noise reduction thin film transistor, and an initial threshold voltage of the noise reduction thin film transistor; and a gate voltage controller coupled to the threshold voltage calculator for adjusting the gate voltage of the noise reduction thin film transistor during the noise reduction phase, to control the noise reduction thin film transistor in an ON state during the noise reduction phase.

Optionally, the gate voltage controller is connected to a voltage terminal in the shift register, the voltage terminal being connected to a gate electrode of the noise reduction thin film transistor and providing the gate voltage to control the noise reduction thin film transistor in a conduction state during the noise reduction phase.

Optionally, the voltage provided by the voltage terminal is provided by a clock signal source.

Optionally, the voltage is provided by a direct current source.

Optionally, the control circuit further comprises a memory for storing the operating time; wherein the threshold voltage calculator is coupled to the timer through the memory.

Optionally, the present threshold voltage is calculated based on Equation (1):

$$V_t = V_{t0} + (V_{gs} - V_{t0}) \cdot \left(1 - e^{\left[-\left(\frac{t \times DC}{\tau \times f}\right)^\beta\right]}\right) \quad (1)$$

wherein t is the operating time; $V_{t0}$ is the initial threshold voltage when t=0; $V_{gs}$ is the gate voltage of the noise reduction thin film transistor; f is a first coefficient; τ is a second coefficient; β is a third coefficient; DC is a duty cycle of a signal received by a gate electrode of the noise reduction thin film transistor; the first coefficient f is a process coefficient for fabricating the noise reduction thin film transistor; and the second coefficient τ and the third coefficient β are obtained by simulation based on a threshold voltage shift property of the noise reduction thin film transistor.

Optionally, a source electrode of the noise reduction thin film transistor is configured to receive a first voltage and a gate electrode of the noise reduction thin film transistor is configured to receive a second voltage during the noise reduction phase; and the gate voltage controller is configured to control the second voltage during the noise reduction phase at a level sufficient for turning on the thin film transistor during the noise reduction phase.

Optionally, the control circuit further includes a pull down node connected to the gate electrode of the noise reduction thin film transistor; wherein a source electrode of the noise reduction thin film transistor is configured to receive a first voltage; the first voltage being a low voltage for maintaining the output terminal at a low voltage level during the noise reduction phase; the pull down node is configured to receive a second voltage during the noise reduction phase; and the gate voltage controller is configured to adjust the second voltage of the noise reduction thin film transistor during the noise reduction phase at a level sufficient for turning on the noise reduction thin film transistor during the noise reduction phase.

Optionally, the gate electrode of the noise reduction thin film transistor is connected to a pull down node for receiving the second voltage, In another aspect, the present invention provides a display apparatus comprising a control circuit described herein.

In another aspect, the present invention provides a method of reducing noise of a shift register unit comprising a shift register having an input terminal, an output terminal for outputting a gate scanning signal during an output phase, and a noise reduction thin film transistor coupled to the output terminal for reducing noise of the shift register by maintaining the output terminal at a low voltage level during a noise reduction phase between two output phases; the method comprising initiating a timing process when the shift register is turned on, to obtain an operating time of the shift register; calculating a present threshold voltage based on the operating time, a gate voltage of the noise reduction thin film transistor, and an initial threshold voltage of the noise reduction thin film transistor; and adjusting the gate voltage of the noise reduction thin film transistor during the noise reduction phase, to control the noise reduction thin film transistor in an ON state during the noise reduction phase.

Optionally, the present threshold voltage is calculated based on Equation (1):

$$V_t = V_{t0} + (V_{gs} - V_{t0}) \cdot \left(1 - e^{\left[-\left(\frac{t \times DC}{\tau \times f}\right)^\beta\right]}\right); \quad (1)$$

wherein t is the operating time; $V_{t0}$ is the initial threshold voltage when t=0; $V_{gs}$ is the gate voltage of the noise reduction thin film transistor; f is a first coefficient; τ is a second coefficient; β is a third coefficient; DC is a duty cycle of a signal received by a gate electrode of the noise reduction thin film transistor; the first coefficient f is a process coefficient of a material for fabricating the noise reduction thin film transistor; and the second coefficient τ and the third coefficient β are obtained by simulation based on a threshold voltage shift property of the noise reduction thin film transistor.

Optionally, the method further comprises providing a source electrode of the noise reduction thin film transistor with a first voltage during the noise reduction phase; and providing a gate electrode of the noise reduction thin film transistor with a second voltage during the noise reduction phase; wherein the step of adjusting the gate voltage of the noise reduction thin film transistor during the noise reduction phase comprises controlling the second voltage during the noise reduction phase at a level sufficient for turning on the noise reduction thin film transistor during the noise reduction phase.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
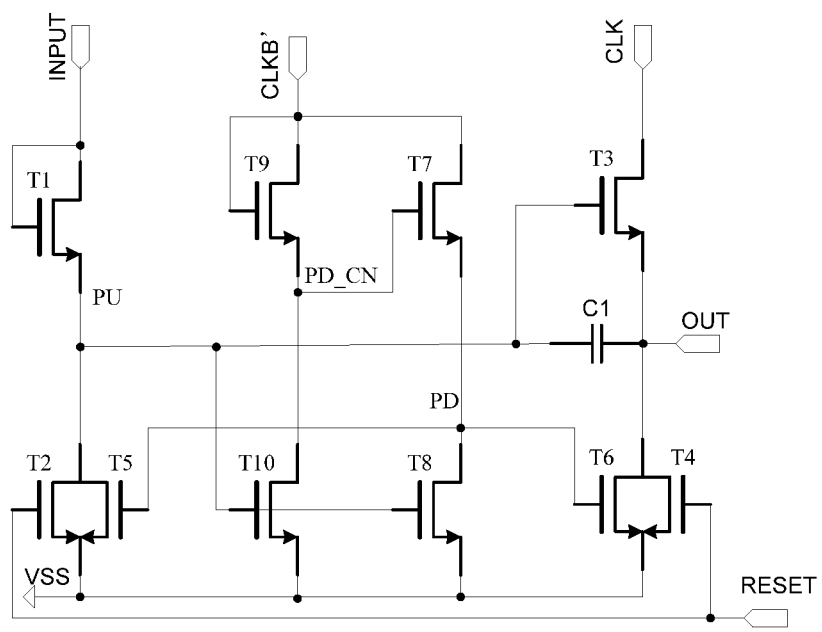
FIGS. 1A-1B are diagrams illustrating the structure of conventional shift register units.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Conventional shift register units typically includes a noise reduction circuit having a noise reduction thin film transistor for reducing noise of the shift register. Specifically, the shift register includes an input terminal and an output terminal for outputting a gate scanning signal to a gate line. In operation, the conventional shift register unit has an output phase, during which the shift register outputs a gate scanning signal to the gate line, a noise reduction phase when the shift register is not outputting the gate scanning signal. The operation of the shift register unit may optionally further include a precharge phase for inputting a clock signal, a reset phase, and a pull down phase. In the noise reduction phase, the thin film transistor of the noise reduction circuit discharges the output terminal and a pull up node of the shift register, maintaining them at a low voltage level. In some conventional shift register units, the gate electrode of the thin film transistor is connected to a pull down node of the shift register, the voltage level of which may be provided by a high voltage direct current source or a clock signal. In conventional shift register units, the voltage level provided by the high voltage direct current source or the clock signal remains constant. However, a threshold voltage shift occurs in the thin film transistor due to operational stress, which increases with the operating time of the thin film transistor. Even if the gate voltage level of the thin film transistor is provided by a clock signal and thus the duty cycle of the thin film transistor may be reduced to, e.g., 50%, the threshold voltage shift may still affect operation of the thin film transistor. For example, the gate voltage provided by the voltage level at the pull down node may be no longer sufficiently high to turn on the thin film transistor, because the threshold voltage has changed to a level higher than the gate voltage over an operation period.

Accordingly, the present disclosure is directed to a control circuit for controlling a noise reduction thin film transistor in a shift register unit and a method of reducing noise of the shift register unit that substantially obviates one or more of the problems due to limitations and disadvantages of the related art. In one aspect, the present disclosure provides a method of reducing noise of a shift register unit. In some embodiments, the shift register unit is one that includes a shift register having an input terminal, an output terminal for outputting a gate scanning signal during an output phase, and a noise reduction circuit having a noise reduction thin film transistor coupled to the output terminal for reducing noise of the shift register by maintaining the output terminal at a low voltage level during a noise reduction phase between two output phases.

Figure 2:
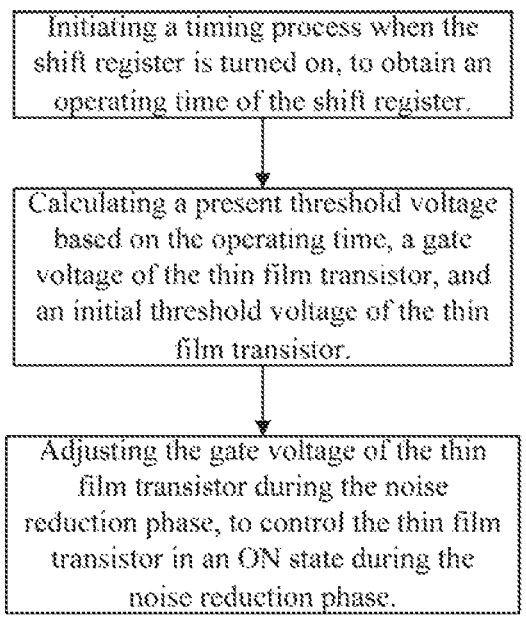
FIG. 2 is a flow chart illustrating a method of reducing noise of a shift register unit in some embodiments.

FIG. 2 is a flow chart illustrating a method of reducing noise of a shift register unit in some embodiments. Referring to FIG. 2, the method in the embodiment includes initiating a timing process when the shift register is turned on, to obtain an operating time of the shift register; calculating a present threshold voltage based on the operating time, a gate voltage of the noise reduction thin film transistor, and an initial threshold voltage of the noise reduction thin film transistor; and adjusting the gate voltage of the noise reduction thin film transistor during the noise reduction phase, to control the noise reduction thin film transistor in an ON state during the noise reduction phase.

The present method calculates the present threshold voltage based on the operating time obtained by the timing process and the gate voltage of the noise reduction thin film transistor. Accordingly, the present method may adjust the gate voltage based on the calculated present threshold voltage, to ensure that the gate voltage is at a level sufficient to turn the noise reduction thin film transistor on. Even if the threshold voltage increases over time during the noise reduction phase, the noise reduction thin film transistor may be controlled in an ON state. Thus, an extended operation life tau the shift register may be achieved.

In some embodiments, the present threshold voltage is calculated based on Equation (1).

$$V_t = V_{t0} + (V_{gs} - V_{t0}) \cdot \left(1 - e^{[-(\frac{t \times DC}{\tau \times f})^\beta]}\right); \quad (1)$$

wherein t is the operating time; $V_{t0}$ is the initial threshold voltage when t=0; $V_{gs}$ is the gate voltage of the noise reduction thin transistor; f is a first coefficient; $\tau$ is a second coefficient; $\beta$ is a third coefficient; DC is a duty cycle of a signal received by a gate electrode of the noise reduction thin film transistor; the first coefficient f is a process coefficient for fabricating the noise reduction thin film transistor; and the second coefficient $\tau$ and the third coefficient $\beta$ are obtained by simulation based on a threshold voltage shift property of the noise reduction thin film transistor.

The first coefficient f, the second coefficient $\tau$, and the third coefficient $\beta$ are fixed values for a noise reduction thin film transistor of a certain type and certain parameters. The first coefficient f, the second coefficient $\tau$, and the third coefficient $\beta$ may be determined once the type and parameters of the noise reduction thin film transistor are known. The threshold voltage shift may be determined based on real time values of the operating time and the gate voltage of the noise reduction thin film transistor.

In some embodiments, the method further includes providing a source electrode of the noise reduction thin film transistor with a first voltage during the noise induction phase; and providing a gate electrode of the noise reduction thin film transistor with a second voltage during the noise reduction phase. Optionally, the step of adjusting the gate voltage of the noise reduction thin film transistor during the noise reduction phase includes controlling the second voltage during the noise reduction phase at a level sufficient for turning on the noise reduction thin film transistor during the noise reduction phase. Optionally, the gate electrode is connected to the pull down node, which is provided with the second voltage. Optionally, the first voltage is a fixed voltage.

Figure 3:
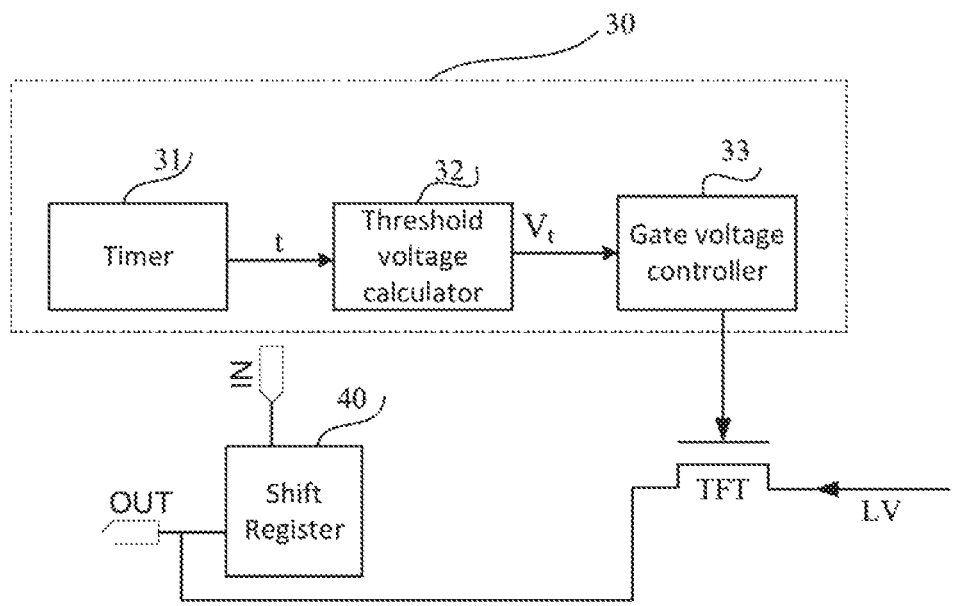
FIG. 3 is a diagram illustrating the structure of a shift register unit and a control circuit in some embodiments.

In another aspect, the present disclosure provides a control circuit for controlling a noise reduction thin film transistor in a shift register unit. In some embodiments, the shift register unit includes a shift register having an input terminal, an output terminal for outputting a gate scanning signal during an output phase, and a noise reduction circuit having a noise reduction thin film transistor coupled to the output terminal for reducing noise of the shift register by maintaining the output terminal at a low voltage level during a noise reduction phase between two output phases. FIG. 3 is a diagram illustrating the structure of a shift register unit and a control circuit in some embodiments. Referring to FIG. 3, the shift register unit includes a shift register 40 and a control circuit 30 for controlling the noise reduction thin film transistor TFT in the shift register unit. The shift register 40 includes an input terminal IN, an output terminal OUT for outputting a gate scanning signal during an output phase, and a noise reduction thin film transistor TFT coupled to the output terminal OUT. The control circuit 30 includes a timer 31 for initiating a timing process when the shift register 40 is turned on, to obtain an operating time of the shift register 40; a threshold voltage calculator 32 coupled to the timer 31 for calculating a present threshold voltage based on the operating time, a gate voltage of the noise reduction thin film transistor TFT, and an initial threshold voltage of the noise reduction thin film transistor TFT; and a gate voltage controller 33 coupled to the threshold voltage calculator 32 for adjusting the gate voltage of the noise reduction thin film transistor TFTF during the noise reduction phase, to control the noise reduction thin film transistor TFT in an ON state during the noise reduction phase. The gate voltage controller is connected to a voltage terminal in the shift register 40. The voltage terminal is connected to a gate electrode of the noise reduction thin film transistor TFT and providing the gate voltage to control the noise reduction thin film transistor TFT in a conduction state during the noise reduction phase. The gate voltage controller adjusts the gate voltage provided by the voltage terminal, controlling the noise reduction thin film transistor TFT in a conduction state during the noise reduction phase.

The present control circuit calculates the present threshold voltage based on the operating time obtained by the timing process and the gate voltage of the noise reduction thin film transistor. Accordingly, the present control circuit may adjust the gate voltage based on the calculated present threshold voltage, to ensure that the gate voltage is at a level sufficient to turn the thin film transistor on. Even if the threshold voltage increases over time during the noise reduction phase, the noise reduction thin film transistor may be controlled in an ON state. Thus, an extended operation life for the shift register may be achieved.

Figure 4:
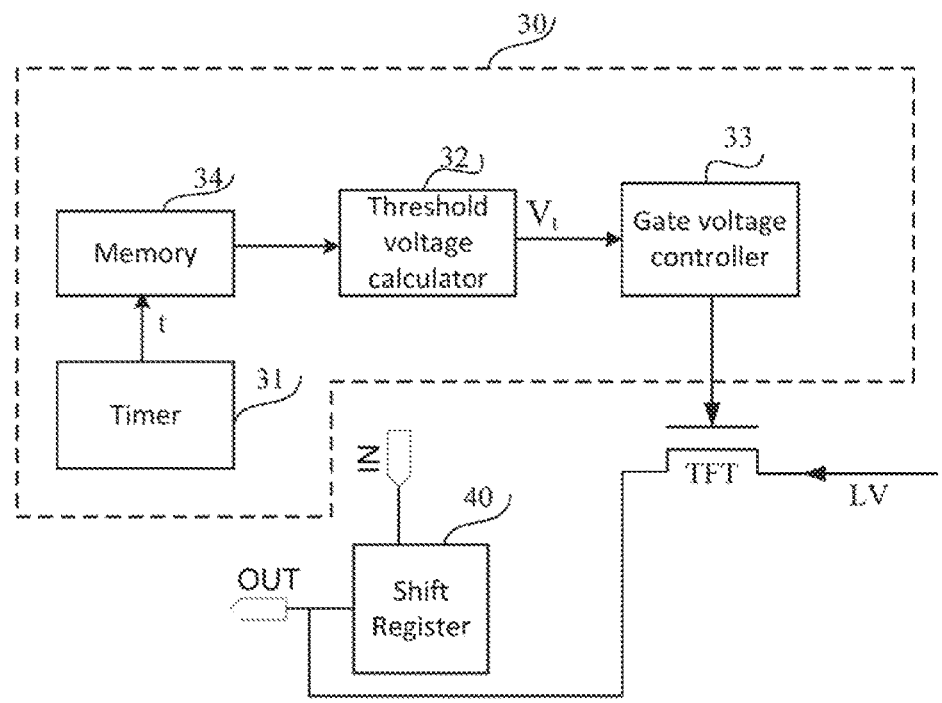
FIG. 4 is a diagram illustrating the structure of a shift register unit and a control circuit in some embodiments.

FIG. 4 is a diagram illustrating the structure of a shift register unit and a control circuit in some embodiments. Referring to FIG. 4, the control circuit 30 in the embodiment further includes a memory 34 for storing the operating time. The threshold voltage calculator 32 is coupled to the timer 31 through the memory 34. By having the memory 34, the operating time of the shift register unit may be stored, and the threshold voltage calculator 32 may obtain the operating time in real time from the memory 34. Optionally, the memory 34 is a non-volatile memory.

In some embodiments, the present threshold voltage is calculated based on Equation (1).

$$V_t = V_{t0} + (V_{gs} - V_{t0}) \cdot \left(1 - e^{[-(\frac{t \times DC}{\tau \times f})^\beta]}\right); \quad (1)$$

wherein t is the operating time; $V_{t0}$ is the initial threshold voltage when t=0; $V_{gs}$ is the gate voltage of the noise reduction thin film transistor; f is a first coefficient; $\tau$ is a second coefficient; $\beta$ is a third coefficient; DC is a duty cycle of a signal received by a gate electrode of the noise reduction thin film transistor; the first coefficient f is a process coefficient for fabricating the noise reduction thin film transistor; and the second coefficient $\tau$ and the third coefficient $\beta$ are obtained by simulation based on a threshold voltage shift property of the noise reduction thin film transistor.

The first coefficient f, the second coefficient $\tau$, and the third coefficient $\beta$ are fixed values for a noise reduction thin film transistor of a certain type and certain parameters. The first coefficient f, the second coefficient $\tau$, and the third coefficient $\beta$ may be determined once the type and parameters of the noise reduction thin film transistor are known.

The threshold voltage shift may be determined based on real time values of the operating time and the gate voltage of the noise reduction thin film transistor.

In some embodiments, a source electrode of the noise reduction thin film transistor is configured to receive a first voltage and a gate electrode of the noise reduction thin film transistor is configured to receive a second voltage during the noise reduction phase; and the gate voltage controller 33 is configured to control the second voltage during the noise reduction phase at a level sufficient for turning on the noise reduction thin film transistor during the noise reduction phase.

In some embodiments, the shift register unit further includes a pull down node connected to the gate electrode of the noise reduction thin film transistor. A source electrode of the noise reduction thin film transistor is configured to receive a first voltage. The first voltage is a low voltage signal for maintaining the output terminal at a low voltage level during the noise reduction phase. The pull down node is configured to receive a second voltage during the noise reduction phase. The gate voltage controller 33 is configured to adjust the second voltage of the noise reduction thin film transistor during the noise reduction phase at a level sufficient for turning on the noise reduction thin film transistor during the noise reduction phase. The gate electrode of the noise reduction thin film transistor is connected to a pull down node for receiving the second voltage.

Figure 5:
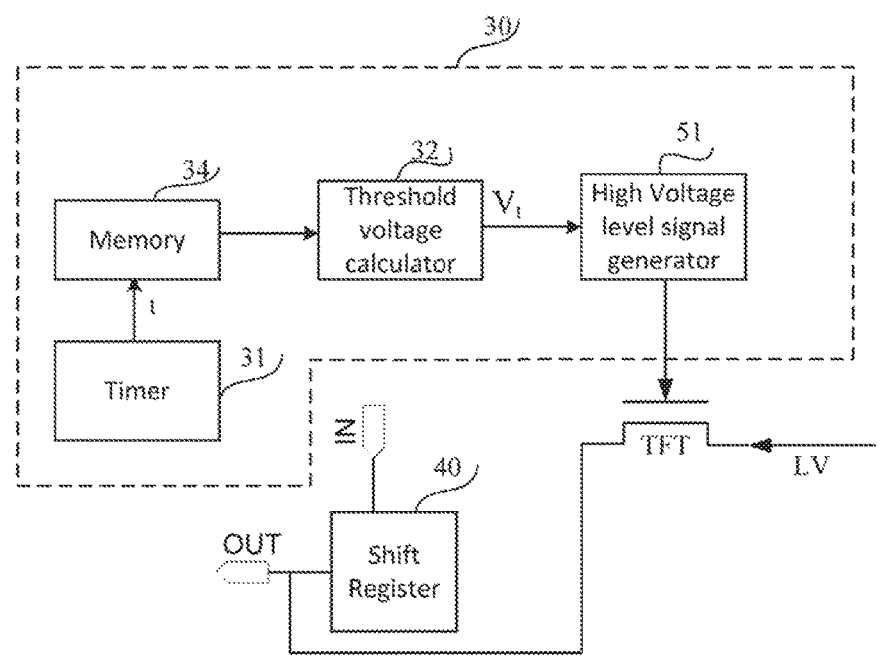
FIG. 5 is a diagram illustrating the structure of a shift register unit and a control circuit in some embodiments.

In some embodiments, the noise reduction thin film transistor is a n-type thin film transistor. The first voltage is a low voltage level signal VSS, and the second voltage is a high voltage level signal VDD. FIG. 5 is a diagram illustrating the structure of a shift register unit and a control circuit in some embodiments. Referring to FIG. 5, the gate voltage controller in the embodiment is a high voltage level signal generator 51, which is a programmable integrated circuit. The high voltage level signal generator 51 adjusts the high voltage level signal VDD based on the present threshold voltage calculated by the threshold voltage calculator 32. The high voltage level signal VDD is then transmitted to the shift register unit.

The present shift register unit and method take into account various factors such as working temperature and duty cycle of the components, adjusts (e.g., increases) the gate voltage of the noise reduction thin film transistor with the increase of the operating time. An extended operation life for the shift register may be achieved in the present shift register unit.

Figure 1B:
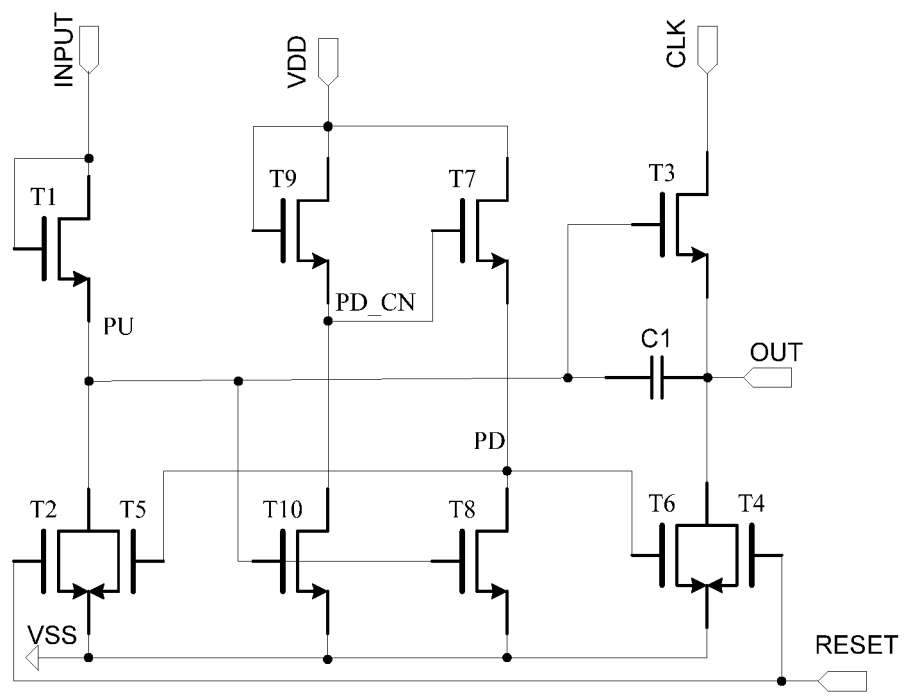

The present shift register unit and the control circuit thereof (including the timer, the threshold voltage calculator, the gate voltage controller, the memory) may be used in various appropriate gate driving circuits. Similarly, the present noise reducing method may be implemented in various appropriate gate driving circuits. Accordingly, numerous alternative embodiments of noise reduction circuit may be practiced for reducing noise of shift register by maintaining the output terminal at a low voltage level during a noise reduction phase between two output phases, e.g., by discharging the output terminal. Examples of appropriate noise reduction circuits include, but are not limited to, the ones illustrated in FIGS. 1A-1B, and the noise reduction circuits disclosed in U.S. Patent Publication Nos. US2016/0133337, US2015/0243367, US2015/025503. As discussed herein throughout, the noise reduction circuit typically includes a noise reduction thin film transistor having a source electrode configured to receive a low voltage level, a drain electrode connected to the output terminal of the shift register. In some embodiments, the low voltage level is allowed to pass from the source electrode through the drain electrode to the output terminal of the shift register to maintain the output terminal at the low voltage level during the noise reduction phase, when the noise reduction thin film transistor is turned on. The noise reduction circuit further includes a voltage terminal for providing a voltage level for turning on the thin film transistor. The voltage at the voltage terminal may be provided by a clock signal source or a direct current voltage source. The thin film transistor may be a p-type or an n-type transistor. When the thin film transistor is an n-type transistor, the voltage provided to the gate electrode is a high voltage level. Optionally, the noise reduction circuit may further include a pull down node for connecting the gate electrode and the voltage level source.

In another aspect, the present disclosure provides a display apparatus having a control circuit described herein. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention, it should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A control circuit for controlling a noise reduction thin film transistor in a shift register unit comprising a shift register having an input terminal, an output terminal for outputting a gate scanning signal during an output phase, and the noise reduction thin film transistor coupled to the output terminal for reducing noise of the shift register by maintaining the output terminal at a low voltage level during a noise reduction phase between two output phases; the control circuit comprising:

a timer for initiating a timing process when the shift register is turned on, to obtain an operating time of the shift register;

a threshold voltage calculator coupled to the timer for calculating a present threshold voltage based on the operating time, a gate voltage of the noise reduction thin film transistor, and an initial threshold voltage of the noise reduction thin film transistor; and a gate voltage controller coupled to the threshold voltage calculator for adjusting the gate voltage of the noise reduction thin film transistor during the noise reduction phase, to control the noise reduction thin film transistor in an ON state during the noise reduction phase;

wherein the gate voltage controller is connected to a voltage terminal in the shift register, the voltage terminal being connected to a gate electrode of the noise reduction thin film transistor and providing the gate voltage to control the noise reduction thin film transistor in a conduction state during the noise reduction phase.

2. The control circuit of claim 1, wherein the voltage provided by the voltage terminal is provided by a clock signal source.

3. The control circuit of claim 1, wherein the voltage is provided by a direct current source.

4. The control circuit of claim 1, further comprising a memory for storing the operating time; wherein the threshold voltage calculator is coupled to the timer through the memory.

5. The control circuit of claim 4, wherein the gate electrode of the noise reduction thin film transistor is connected to a pull down node for receiving a second voltage.

6. The control circuit of claim 1, wherein the present threshold voltage is calculated based on Equation (1):

$$V_t = V_{t0} + (V_{gs} - V_{t0}) \cdot \left(1 - e^{\left[-\left(\frac{t \times DC}{\tau \times f}\right)^{\beta}\right]}\right) \quad (1)$$

wherein t is the operating time; $V_{t0}$ is the initial threshold voltage when t=0; $V_{gs}$ is the gate voltage of the noise reduction thin film transistor; f is a first coefficient; τ is a second coefficient; β is a third coefficient; DC is a duty cycle of a signal received by a gate electrode of the noise reduction thin film transistor;

the first coefficient f is a process coefficient for fabricating the noise reduction thin film transistor; and the second coefficient τ and the third coefficient β are obtained by simulation based on a threshold voltage shift property of the noise reduction thin film transistor.

7. The control circuit of claim 1, wherein a source electrode of the noise reduction thin film transistor is configured to receive a first voltage and a gate electrode of the noise reduction thin film transistor is configured to receive a second voltage during the noise reduction phase; and the gate voltage controller is configured to control the second voltage during the noise reduction phase at a level sufficient for turning on the thin film transistor during the noise reduction phase.

8. The control circuit of claim 1, further comprising a pull down node connected to the gate electrode of the noise reduction thin film transistor;

wherein a source electrode of the noise reduction thin film transistor is configured to receive a first voltage; the first voltage being a low voltage for maintaining the output terminal at a low voltage level during the noise reduction phase;

the pull down node is configured to receive a second voltage during the noise reduction phase; and the gate voltage controller is configured to adjust the second voltage of the noise reduction thin film transistor during the noise reduction phase at a level sufficient for turning on the noise reduction thin film transistor during the noise reduction phase.

9. A display apparatus, comprising a control circuit of claim 1.

10. A method of reducing noise of a shift register unit comprising a shift register having an input terminal, an output terminal for outputting a gate scanning signal during an output phase, and a noise reduction thin film transistor coupled to the output terminal for reducing noise of the shift register by maintaining the output terminal at a low voltage level during a noise reduction phase between two output phases;

the method comprising:

initiating a timing process when the shift register is turned on, to obtain an operating time of the shift register;

calculating a present threshold voltage based on the operating time, a gate voltage of the noise reduction thin film transistor, and an initial threshold voltage of the noise reduction thin film transistor; and adjusting the gate voltage of the noise reduction thin film transistor during the noise reduction phase, to control the noise reduction thin film transistor in an ON state during the noise reduction phase;

wherein the present threshold voltage is calculated based on Equation (1):

$$V_t = V_{t0} + (V_{gs} - V_{t0}) \cdot \left(1 - e^{\left[-\left(\frac{t \times DC}{\tau \times f}\right)^{\beta}\right]}\right) \quad (1)$$

wherein t is the operating time; $V_{t0}$ is the initial threshold voltage when t=0; $V_{gs}$ is the gate voltage of the noise reduction thin film transistor; f is a first coefficient; τ is a second coefficient; β is a third coefficient; DC is a duty cycle of a signal received by a gate electrode of the noise reduction thin film transistor;

the first coefficient f is a process coefficient of a material for fabricating the noise reduction thin film transistor; and the second coefficient τ and the third coefficient β are obtained by simulation based on a threshold voltage shift property of the noise reduction thin film transistor.

11. A method of reducing noise of a shift register unit comprising a shift register having an input terminal, an output terminal for outputting a gate scanning signal during an output phase, and a noise reduction thin film transistor coupled to the output terminal for reducing noise of the shift register by maintaining the output terminal at a low voltage level during a noise reduction phase between two output phases;

the method comprising:

initiating a timing process when the shift register is turned on, to obtain an operating time of the shift register;

calculating a present threshold voltage based on the operating time, a gate voltage of the noise reduction thin film transistor, and an initial threshold voltage of the noise reduction thin film transistor;

adjusting the gate voltage of the noise reduction thin film transistor during the noise reduction phase, to control the noise reduction thin film transistor in an ON state during the noise reduction phase;
providing a source electrode of the noise reduction thin film transistor with a first voltage during the noise reduction phase; and
providing a gate electrode of the noise reduction thin film transistor with a second voltage during the noise reduction phase;
wherein the step of adjusting the gate voltage of the noise reduction thin film transistor during the noise reduction phase comprises controlling the second voltage during the noise reduction phase at a level sufficient for turning on the noise reduction thin film transistor during the noise reduction phase.

* * * * *